United States Patent
Mitsuhashi et al.

(10) Patent No.: US 11,473,182 B2
(45) Date of Patent: *Oct. 18, 2022

(54) COMPONENT FOR USE IN PLASMA PROCESSING APPARATUS, PLASMA PROCESSING APPARATUS, AND METHOD FOR MANUFACTURING THE COMPONENT

(71) Applicant: TOKYO ELECTRON LIMITED, Tokyo (JP)

(72) Inventors: Koji Mitsuhashi, Miyagi (JP); Satoshi Nishimura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 163 days.

This patent is subject to a terminal disclaimer.

(21) Appl. No.: 17/021,643

(22) Filed: Sep. 15, 2020

(65) Prior Publication Data

US 2021/0002754 A1 Jan. 7, 2021

Related U.S. Application Data

(63) Continuation of application No. 14/795,062, filed on Jul. 9, 2015, now Pat. No. 10,808,309.

(30) Foreign Application Priority Data

Jul. 10, 2014 (JP) .............................. JP2014-142538
Jun. 22, 2015 (JP) .............................. JP2015-124725

(51) Int. Cl.
  *C23C 4/11* (2016.01)
  *H01J 37/32* (2006.01)
  (Continued)

(52) U.S. Cl.
  CPC ................. *C23C 4/12* (2013.01); *C23C 4/02* (2013.01); *C23C 4/06* (2013.01); *C23C 4/11* (2016.01);
  (Continued)

(58) Field of Classification Search
  CPC ...................................... C23C 16/45563–4558
  (Continued)

(56) References Cited

U.S. PATENT DOCUMENTS 5,772,833 A 6/1998 Inazawa et al.
6,120,640 A * 9/2000 Shih ...................... C23C 28/044
  156/914

(Continued)

FOREIGN PATENT DOCUMENTS

CN 103794458 A 5/2014
CN 103794460 A 5/2014
(Continued)

*Primary Examiner* — Charlee J. C. Bennett
(74) *Attorney, Agent, or Firm* — Weihrouch IP

(57) ABSTRACT

A component for use in a plasma processing apparatus, which is to be exposed to a plasma, includes a base material, an alumite layer and a thermally sprayed film. The base material has a plurality of through holes and a rough surface at which one end of each of the through holes is opended. The alumite layer is formed on a surface of the base material having the rough surface by an anodic oxidation process. The thermally sprayed film is formed on the rough surface with the alumite layer therebetween.

12 Claims, 4 Drawing Sheets

(51) Int. Cl.
  *C23C 4/12* (2016.01)
  *C23C 4/06* (2016.01)
  *C23C 4/18* (2006.01)
  *C23C 4/02* (2006.01)
  *C25D 11/04* (2006.01)
  *C23C 16/455* (2006.01)

(52) U.S. Cl.
  CPC .......... *C23C 4/18* (2013.01); *C23C 16/45565* (2013.01); *C25D 11/04* (2013.01); *H01J 37/3244* (2013.01); *H01J 37/32477* (2013.01); *H01J 37/32559* (2013.01); *H01J 37/32633* (2013.01)

(58) Field of Classification Search
  USPC ........................................ 156/345.33–345.34
  See application file for complete search history.

(56) References Cited

U.S. PATENT DOCUMENTS

| | | | | |
|---|---|---|---|---|
| 6,182,603 | B1* | 2/2001 | Shang | C23C 16/4405 118/723 ME |
| 9,431,221 | B2* | 8/2016 | Chen | H01L 21/3065 |
| 2003/0010446 | A1* | 1/2003 | Kajiyama | C23C 16/4404 156/345.1 |
| 2003/0215643 | A1 | 11/2003 | Morita | |
| 2004/0060661 | A1* | 4/2004 | Nishimoto | C23C 16/4404 156/345.43 |
| 2005/0156063 | A1* | 7/2005 | Tsuji | C23C 16/401 239/548 |
| 2007/0079934 | A1* | 4/2007 | Murata | C04B 41/009 156/345.34 |
| 2009/0159001 | A1* | 6/2009 | Um | C23C 16/45565 118/715 |
| 2010/0224325 | A1* | 9/2010 | Himori | H01J 37/3255 156/345.44 |
| 2011/0048642 | A1* | 3/2011 | Mihara | H01J 37/32192 156/345.34 |
| 2011/0283942 | A1* | 11/2011 | Iwata | C23C 16/4404 118/725 |
| 2012/0073753 | A1* | 3/2012 | Satoh | H01J 37/3244 156/345.33 |
| 2013/0284373 | A1 | 10/2013 | Sun | |
| 2014/0174662 | A1* | 6/2014 | Kitajima | C23C 8/36 156/345.47 |
| 2016/0076129 | A1* | 3/2016 | Nagayama | C23C 4/131 427/454 |
| 2016/0296981 | A1* | 10/2016 | Baluja | C11D 11/0041 |
| 2016/0322200 | A1* | 11/2016 | Alayavalli | H01J 37/3244 |

FOREIGN PATENT DOCUMENTS

| | | |
|---|---|---|
| JP | 7-142455 A | 6/1995 |
| JP | 1998-340896 A | 12/1998 |
| JP | 2001102199 A | 4/2001 |
| JP | 2004-190136 A | 7/2004 |
| JP | 2005-531157 A | 10/2005 |
| JP | 2007-227443 A | 9/2007 |
| JP | 2008-303442 A | 12/2008 |
| JP | 2014-96553 A | 5/2014 |
| WO | 2004003962 A2 | 1/2004 |
| WO | 2013022066 A1 | 2/2013 |
| WO | WO-2013022066 A1 * | 2/2013 ............... C23C 8/36 |

* cited by examiner

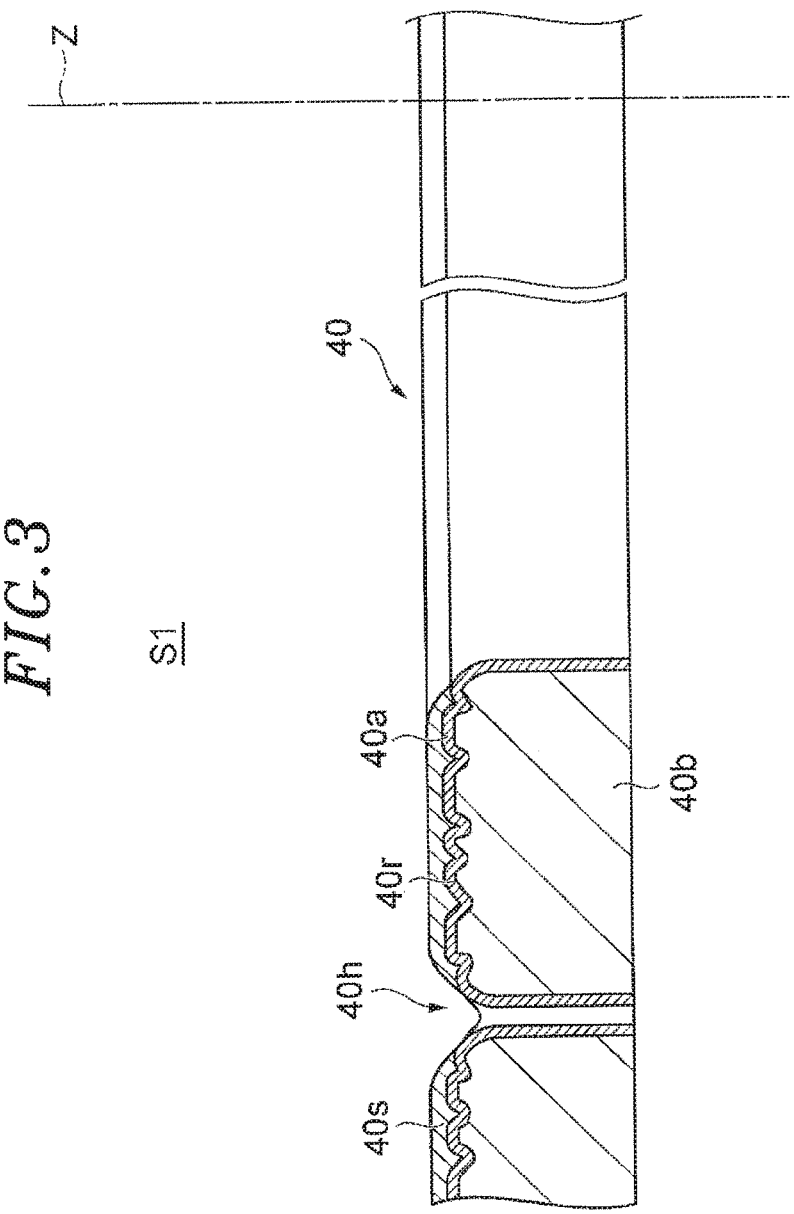

COMPONENT FOR USE IN PLASMA PROCESSING APPARATUS, PLASMA PROCESSING APPARATUS, AND METHOD FOR MANUFACTURING THE COMPONENT

CROSS-REFERENCE TO RELATED APPLICATIONS

This application is a continuation of U.S. patent application Ser. No. 14/795,062, filed on Jul. 9, 2015, which claims priority to Japanese Patent Application Nos. 2014-142538 and 2015-124725 respectively filed on Jul. 10, 2014 and Jun. 22, 2015, the entire contents of which are incorporated herein by reference.

FIELD OF THE INVENTION

The disclosure relates to a component for use in a plasma processing apparatus, the plasma processing apparatus, and a method for manufacturing the component.

BACKGROUND OF THE INVENTION

In a plasma processing apparatus used for manufacturing electronic devices, a target object to be processed is accommodated in a processing chamber and a plasma is generated in a space within the processing chamber. In such a plasma processing apparatus, a plasma resistant film is formed on an inner wall surface of the processing chamber and surfaces of components provided in the processing chamber. The surfaces on which the plasma resistant film is formed include a surface of a shower part for injecting a gas into the processing chamber in a shower shape.

The shower part includes a base material made of aluminum and having a plurality of gas injection holes. In order to form a film on the base material, an anodic oxidation process (alumite process) is performed on the base material. Such a film is disclosed in Japanese Patent Application Publication No. H7-142455.

Among surfaces of the shower part, especially a surface facing a space where the plasma is generated (hereinafter, referred to as "first surface") requires an excellent plasma resistance. Therefore, a thermally sprayed film made of yttria ($Y_2O_3$) may be formed on the first surface.

Since, however, an alumite layer is formed on the surface of the base material of the shower part by the anodic oxidation process as described above, the adhesivity of the thermally sprayed film to the alumite layer is poor.

Accordingly, it is considered to remove the alumite layer from the first surface, perform roughening (e.g., blast processing) on the first surface, and form a thermally sprayed film on the roughened first surface.

However, in the shower part thus manufactured, discharge may occur near ends of through holes which are opened at the first surface and this may result in damage to the shower plate. The discharge may also occur in another component having a plurality of through holes.

SUMMARY OF THE INVENTION

In view of the above, it is required to improve a withstand voltage of a component having through holes and exposed to a plasma.

In accordance with an aspect, there is provided a component for use in a plasma processing apparatus, which is to be exposed to a plasma. The component includes a base material, an alumite layer and a thermally sprayed film. The base material has a plurality of through holes and a rough surface at which one end of each of the through holes is opened. The alumite layer is formed on a surface of the base material having the rough surface by an anodic oxidation process. The thermally sprayed film is formed on the rough surface with the alumite layer therebetween.

In accordance with another aspect, there is provided a plasma processing apparatus including the above component.

In accordance with still another aspect, there is provided a method for manufacturing a component for use in a plasma processing apparatus, which is to be exposed to a plasma. The method includes: performing roughening on one surface of a base material at which one end of each of a plurality of through holes is opened; performing an alumite process on a surface of the base material which includes a rough surface formed by the roughening; and forming a thermally sprayed film on an alumite layer formed by the alumite process.

BRIEF DESCRIPTION OF THE DRAWINGS

The objects and features of the disclosure will become apparent from the following description of embodiments, given in conjunction with the accompanying drawings, in which:

FIG. 3 is an enlarged cross sectional view showing a part of a baffle plate according to an embodiment.

DETAILED DESCRIPTION OF THE EMBODIMENTS

Figure 1:
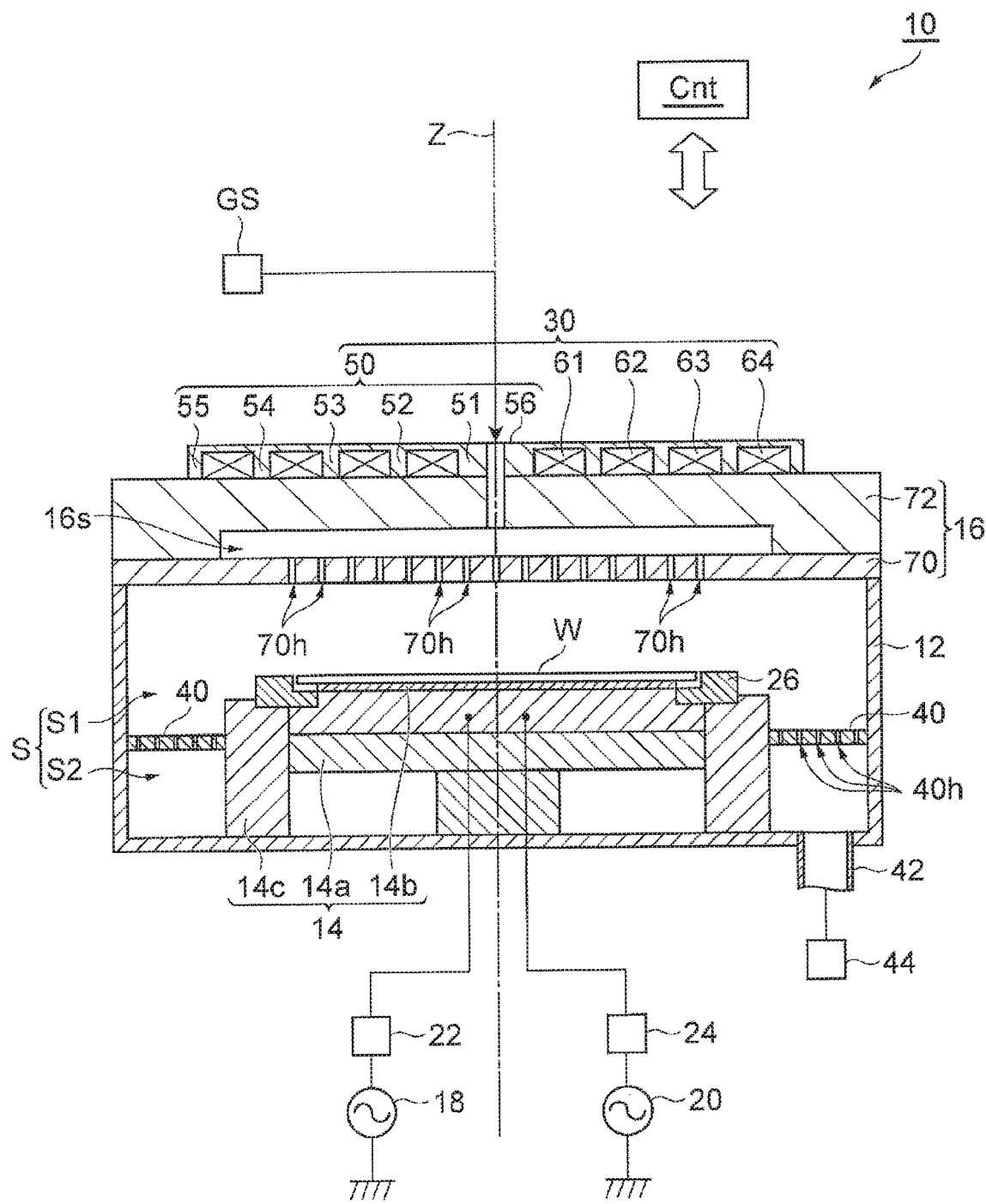
FIG. 1 is a cross sectional view schematically showing a plasma processing apparatus according to an embodiment.

Hereinafter, embodiments will be described in detail with reference to the accompanying drawings. Like reference numerals will denote like or corresponding parts throughout the respective drawings.

FIG. 1 is a cross sectional view schematically showing a plasma processing apparatus according to an embodiment. A plasma processing apparatus 10 shown in FIG. 1 is a capacitively coupled plasma processing apparatus and includes a processing chamber 12. The processing chamber 12 is a substantially cylindrical container. A plasma resistant film is formed on an inner wall surface of the processing chamber 12. For example, an anodic oxidation process may be performed on the inner wall surface of the processing chamber 12, or a film of yttria ($Y_2O_3$) may be formed on the inner wall surface of the processing chamber 12. The processing chamber 12 has an inner space S.

A mounting table 14 is provided in the processing chamber 12. The mounting table 14 includes a base 14a, an electrostatic chuck 14b, and a supporting part 14c. The base 14a is a conductive member made of, e.g., aluminum, and has a substantially disc shape.

A focus ring 26 is provided at a peripheral area of a top surface of the base 14a to surround an edge of the wafer W. An electrostatic chuck 14b is provided on a central area of the top surface of the base 14a. The base 14a and the electrostatic chuck 14b are supported by the supporting part 14c. The supporting part 14c is a substantially cylindrical insulating member. The supporting part 14c is made of, e.g., quartz.

The electrostatic chuck 14b is formed in a substantially disc shape and has an electrode film embedded in insulating films, for example. A target object (hereinafter, referred to as "wafer W") is attracted and held on the electrostatic chuck 14b by an electrostatic force generated by a DC voltage applied from a DC power supply to the electrode film via a switch. The wafer W is mounted on the electrostatic chuck 14b such that the center of the wafer W is positioned on an axis Z that coincides with a central axis of the electrostatic chuck 14b, i.e., the axis Z extending in a vertical direction.

The base 14a serves as a lower electrode. A high frequency power supply 18 for generating a high frequency power for plasma generation is connected to the base 14a via a first matching unit 22. The high frequency power supply 18 generates a high frequency power having a frequency of about 27 MHz or above, e.g., about 100 MHz. The first matching unit 22 has a circuit for matching an output impedance of the first matching unit 22 with an input impedance of a load side (lower electrode side). The high frequency power supply 18 may be connected to the upper electrode 16 via the first matching unit 22.

A high frequency power supply 20 for generating a high frequency bias power for ion attraction is connected to the base 14a via a second matching unit 24. The high frequency power supply 20 generates a high frequency power having a frequency ranging from about 400 kHz to 13.56 MHz, e.g., about 3.2 MHz. The second matching unit 24 has a circuit for matching an output impedance of the second matching unit with the input impedance of the load side (lower electrode side).

An upper electrode 16 is provided above the base 14a, i.e., the lower electrode, to face the lower electrode via the space S. The upper electrode 16 includes a shower plate and a holding body 72. The holding body 72 has a substantially disc shape and is made of, e.g., aluminum. The anodic oxidation process, for example, has been performed on the surface of the holding body 72. The holding body 72 holds the shower plate 40 at a bottom surface thereof.

The shower plate 70 has a substantially disc shape. A plurality of through holes 70h to be described later, i.e., a plurality of gas injection holes, is formed through the shower plate 70. The upper electrode 16 including the shower plate 70 and the holding body 72 provides a gas diffusion space 16s communicating with the plurality of through hole 70h. A gas supply unit GS provided outside the processing chamber 12 is connected to the gas diffusion space 16s. The gas supply unit GS includes a plurality of gas sources, a plurality of flow rate controllers, and a plurality of valves. Each of the gas sources is connected to the gas diffusion space 16s via the flow rate controller and the valve which correspond thereto.

A baffle plate 40 is provided between the mounting table 14 and a sidewall of the processing chamber 12. The baffle plate 40 has a substantially annular shape. An inner periphery of the baffle plate 40 is coupled to an outer periphery of the mounting table 14. An outer periphery of the baffle plate 40 is coupled to the sidewall of the processing chamber 12.

A plurality of through holes 40h is formed through the baffle plate 40. The through holes 40h have a width that prevents a plasma from leaking downward through the baffle plate 40. For example, the width of the through holes 40h is about 3 mm or less. Due to the presence of the baffle plate 40, the space S is divided into a space S1 above the baffle plate 40 and a space S2 below the baffle plate 40. In the case of processing the wafer W by the plasma processing apparatus 10, the wafer W is accommodated in the space S1 and held on the electrostatic chuck 14b.

A gas exhaust line 42 is connected to the bottom portion of the processing chamber 12 which is located below the baffle plate 40. Further, the gas exhaust line 42 is connected to a gas exhaust unit 44. The gas exhaust unit 44 includes a pressure-reducing pump for reducing a pressure in the space S, e.g., a turbo molecular pump.

As shown in FIG. 1, an electromagnet 30 is provided outside the processing chamber 12, i.e., above the upper electrode 16. The electromagnet 30 may not be provided. The electromagnet 30 includes a core member 50 and coils 61 to 64. The core member 50 has a structure in which a columnar part 51, a plurality of cylindrical parts 52 to 55 and a base part 56 are formed as one unit. The core member 50 is made of a magnetic material. The base part 56 has a substantially disc shape and is disposed such that a central axis of the base part 56 coincides with the axis Z. The columnar part 51 and the cylindrical parts 52 to 55 extend downward from the bottom surface of the base part 56. The columnar part 51 has a substantially columnar shape and extends such that the central axis thereof coincides with the axis Z. Each of the cylindrical parts 52 to 55 has a cylindrical shape extending along the axis Z. The cylindrical parts 52 to 55 extend along a plurality of concentric circles centering about the axis Z.

A groove is defined between the columnar part 51 and the cylindrical part 52. A coil 61 wound around an outer peripheral surface of the columnar part 51 is accommodated in the groove. A groove is defined between the cylindrical part 52 and the cylindrical part 53. A coil 62 wound around an outer peripheral surface of the cylindrical part 52 is accommodated in the groove. A groove is defined between the cylindrical part 53 and the cylindrical part 54. A coil 63 wound around an outer peripheral surface of the cylindrical part 53 is accommodated in the groove. A groove is defined between the cylindrical part 54 and the cylindrical part 55. A coil 64 wound around an outer peripheral surface of the cylindrical part 54 is accommodated in the groove. Both ends of each of the coils 61 to 64 are connected to a current source. Supply start and supply stop of a current to each of the coils 61 to 64 and a current value can be controlled by a control signal from a control unit Cnt to be described later.

The control unit Cnt may be a programmable computer device. The control unit Cnt can transmit control signals for controlling a level of the high frequency power generated by the high frequency power supply 18, a level of the high frequency power generated by the high frequency power supply 20, a gas exhaust amount of the gas exhaust unit 44, a type and a flow rate of a gas supplied from the gas supply unit GS, and a current supplied from the current source to each of the coils 61 to 64.

In the case of performing plasma processing by using the plasma processing apparatus 10, a gas from a gas source selected among a plurality of gas sources passes through the gas diffusion space 16s and is injected to the space S through the through holes 70h. A pressure in the space S within the processing chamber 12 is set to a desired level by the gas exhaust unit 44. The high frequency power is supplied from the high frequency power supply 18 to the base 14a. The high frequency bias power is supplied from the high frequency power supply 20 to the base 14a. Accordingly, the gas is excited above the wafer W and a plasma is generated. A magnetic field is generated in the space S by supplying a current to each of the coils 61 to 64. Plasma density distribution above the wafer W is controlled by the magnetic field thus generated. The wafer W is processed by exposure to the plasma.

Hereinafter, the shower plate 70 and the baffle plate 40 will be described in detail. First, the shower plate 70 will be described. FIGS. 2A to 2D are cross sectional views showing a part of the shower plate 70 and a manufacturing process of the shower plate 70. In FIGS. 2A to 2D, a first surface that faces the space S in a state where the shower plate 70 is attached to the plasma processing apparatus 10 and a rough surface formed on the first surface are directed upward, and a portion including a surface opposite to the rough surface or the first surface is not illustrated.

Figure 2A:
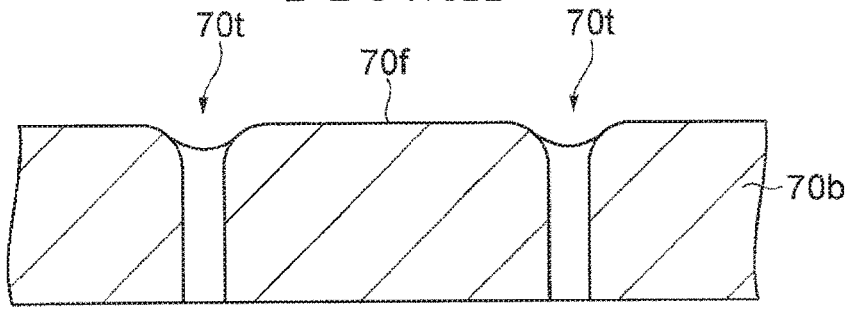
FIGS. 2A to 2D are cross sectional views showing a part of a shower plate according to an embodiment and a manufacturing process of the shower plate.
Figure 2B:
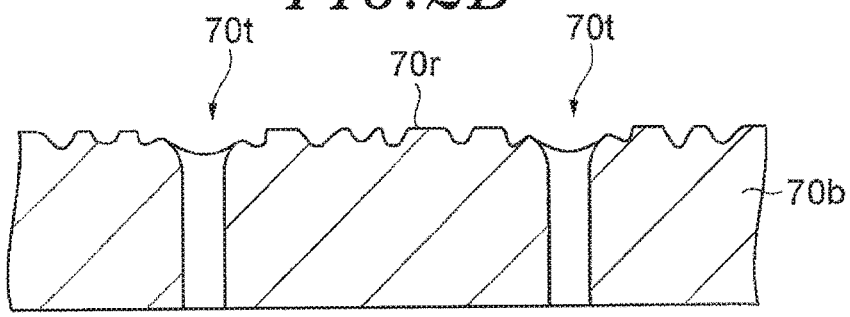
Figure 2C:
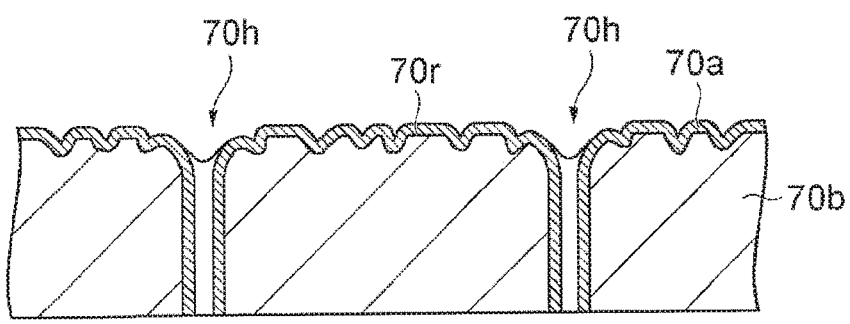
Figure 2D:
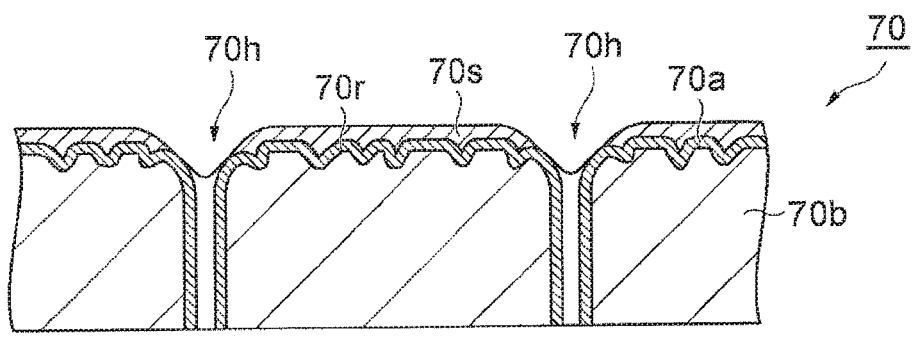

As shown in FIG. 2D, the shower plate 70 includes a base material 70b, an alumite layer 70a, and a thermally sprayed film 70s. In order to manufacture the shower plate 70, the base material 70b is first prepared. As shown in FIG. 2A, the base material 70b has a substantially disc shape and is made of, e.g., aluminum. The base material 70b has a substantially flat exposed surface 70f. The exposed surface 70f is a source of the rough surface facing the space S in the plasma processing apparatus 10. A plurality of through holes 70t is formed in the base material 70b to penetrate through the base material 70b in a thickness direction thereof from the exposed surface 70f. Each of the through holes 70t has a tapered shape at least at an open end thereof at the exposed surface 70f side. In other words, chamfering processing is performed on the base material 70b near the ends of the through holes 70t opened at the exposed surface 70f. For example, 45° chamfering (so-called C chamfering) or round chamfering (so-called R chamfering) is performed on the base material 70b near the ends of the through holes 70t opened at the exposed surface 70f. The chamfering processing may be performed on the base material 70b not only near the ends of the through holes 70t opened at the exposed surface 70f but also near the ends of the through holes 70t opended at the opposite surface.

Next, in manufacturing the shower plate 70, roughening is performed on the exposed surface 70f. For example, blast processing is performed on the exposed surface 70f. As a consequence, the exposed surface that has been subjected to the roughening, i.e., a rough surface 70r, is obtained as shown in FIG. 2B. The rough surface 70r may have an arithmetic average roughness Ra of, e.g., about 1.5 μm to 5 μm. In the blast processing for forming the rough surface 70r, an abrasive (blast material) having a grain size of F40 to F220 defined in JIS R 6001 may be used. For example, an abrasive made of alumina ($Al_2O_3$) having a grain size of F60 defined in JIS R 6001 may be used for the blast processing. The abrasive may be silicon carbide (SiC), glass bead, zirconium or the like.

Then, in manufacturing the shower plate 70, an alumite process (anodic oxidation process) is performed on the base material 70b. In the anodic oxidation process, organic acid-based solution may be used, for example. Accordingly, the alumite layer 70a is formed on the surface of the base material 70b which includes the rough surface 70r and surfaces defining the through holes 70t as shown in FIG. 2C. The alumite layer 70a may have a film thickness ranging from, e.g., about 20 μm to 150 μm. Further, the alumite layer 70a may have a film thickness of about 50 μm or above. The alumite layer 70a thus obtained provides, on the rough surface 70r, a surface having irregularities reflecting the irregularities of the rough surface 70r. The alumite layer 70a is also formed on wall surfaces defining the through holes 70t. The through holes 70h of the shower plate 70, i.e., the gas injection holes, are defined by the alumite layer 70a formed on the wall surfaces.

Next, in manufacturing the shower plate 70, the thermally sprayed film 70s is formed on the rough surface 70r with the alumite layer 70a therebetween by a thermal spraying process. The thermally sprayed film 70s is made of, e.g., yttria ($Y_2O_3$, yttrium oxide). The thermally sprayed film 70s has a film thickness ranging from, e.g., about 150 μm to 250 μm.

In the shower plate 70 thus manufactured, the alumite layer 70a is formed on the rough surface 70r. The surface of the alumite layer 70a formed on the rough surface 70r also becomes a rough surface. Therefore, the adhesivity of the thermally sprayed film 70s formed on the rough surface 70r with the alumite layer 70a therebetween is improved.

The shower plate 70 is a part of the upper electrode 16, so that a potential difference may be generated. Since, however, the alumite layer 70a is formed after the roughening of the base material 70b, the alumite layer 70a having a sufficient thickness is ensured in the shower plate 70. Therefore, a withstand voltage, especially a withstand voltage near the open ends of the through holes 70h is increased. Accordingly, the damage to the shower plate 70 by the discharge can be reduced.

When the film thickness of the alumite layer 70a is about 20 μm or above, an excellent withstand voltage is obtained. When the film thickness of the alumite layer 70a is about 50 μm or above, a more excellent withstand voltage is obtained. When the film thickness of the alumite layer 70a is about 150 μm or less, it is possible to prevent or reduce generation of cracks at the alumite layer 70a.

Hereinafter, the baffle plate 40 will be described. FIG. 3 is an enlarged cross sectional view showing a part of the baffle plate according to an embodiment. As shown in FIG. 3, the baffle plate 40 includes a base material 40b, an alumite layer 40a, and a thermally sprayed film 40s.

The base material 40b is an annular plate-shaped member that can extend between the mounting table 14 and the sidewall of the processing chamber 12. The base material 40b is made of, e.g., aluminum. Through holes 40h are formed through the base material 40b in a thickness direction thereof. Open ends of the through holes 40h have a tapered shape as in the case of the through holes 70t of the shower plate 70. In other words, chamfering processing is performed on the base material 40b near the open ends of the through holes 40h.

The rough surface 40r of the base material 40b faces the space S1 and is formed by performing roughening, e.g., blast processing, on a first surface of the flat base material 40b. The alumite layer 40a is formed on the surface of the base material 40b by the alumite process. The alumite layer 40a is formed on the surface of the base material 40b after the formation of the rough surface 40r. The film thickness of the alumite layer 40a may range from about 20 μm to 150 μm. Further, the film thickness of the alumite layer 40a may be about 50 μm or above.

The alumite layer 40a is also formed on the wall surfaces defining the through holes of the base material 40b. The through holes 40h of the baffle plate 40 are defined by the alumite layer 40a formed on the wall surfaces.

The thermally sprayed film 40s is formed on the rough surface 40r with the alumite layer 40a therebetween. The thermally sprayed film 40s is made of, e.g., yttria ($Y_2O_3$, yttrium oxide). The film thickness of the thermally sprayed film 40s ranges from, e.g., about 150 μm to 250 μm.

It is also possible to perform roughening on a surface opposite to the rough surface 40r and form a thermally sprayed film on the rough surface obtained by the roughening via an alumite layer.

In the baffle plate 40, the alumite layer 40a is formed on the rough surface 40r, and the surface of the alumite layer 40a formed on the rough surface 40r also becomes a rough surface. Therefore, the adhesivity of the thermally sprayed film 40s formed on the rough surface 40r with the alumite layer 40a therebetween is improved.

In the baffle plate 40, a potential difference may be generated by the effect of the magnetic field generated by the electromagnet 30. Since, however, the alumite layer 40a is formed after the roughening of the base material 40b, the alumite layer having a sufficient thickness is ensured in the baffle plate 40. Accordingly, a withstand voltage, especially a withstand voltage near the open ends of the through holes 40h is increased. As a result, the damage to the baffle plate 40 by the discharge can be reduced.

While the embodiments have been described, various modifications can be made without being limited to the above-described embodiments. For example, in the above-described embodiments, the shower plate 70 and the baffle plate 40 are provided as a component having a plurality of through holes. However, the technical concept of the disclosure may be applied to any component as long as it is exposed to a plasma and a potential difference can be generated.

The component having a plurality of through holes to which the technical concept of the disclosure is applied may be an annular gas supply member provided in the processing chamber along the sidewall of the processing chamber of the plasma processing apparatus. Such a gas supply member may be a peripheral introduction part, especially an annular line of the peripheral introduction part, of a plasma processing apparatus disclosed in Japanese Patent Application Publication No. 2014-096553. The annular line is provided along a cylindrical sidewall of the processing chamber of the plasma processing apparatus and extends annularly about the center of the axis extending in the vertical direction in the processing chamber. A plurality of inlet ports (gas inlet ports) arranged in the circumferential direction about the axis, i.e., a plurality of through holes, is formed in the annular line. By applying the technical concept of the disclosure to the annular line, the withstand voltage of the annular line can be improved.

A method for manufacturing the shower plate 70 and the baffle plate 40 can also be applied to the manufacturing of other components used in the plasma processing apparatus. Hereinafter, an embodiment of the method for manufacturing the shower plate 70 and the baffle plate 40 will be described. In this method, a base material (e.g., aluminum) is processed in a predetermined shape. Next, roughening is performed on a surface (or a part of the surface) of the base material. As a consequence, a rough surface is formed on the base material. The rough surface may have an arithmetic average roughness Ra of, e.g., about 1.5 μm to 5 μm. As for the roughening, blast processing may be used, for example. In the blast processing, an abrasive (blast material) having a grain size of F40 to F220 defined in JIS R 6001 may be used. For example, an abrasive made of alumina having a grain size of F60 defined in JIS R 6001 may be used for the blast processing. The abrasive may be silicon carbide (SiC), glass bead, zirconium or the like.

Next, in this method, the base material is cleaned and dried, and an organic material or the like is removed from the base material. Then, an alumite layer is formed on the surface of the base material which includes the rough surface. Organic acid-based solution, for example, may be used for forming the alumite layer. Thereafter, a thermally sprayed film is formed on the alumite layer by a thermal spraying process. The thermally sprayed film is made of, e.g., yttria (yttrium oxide). The manufacturing of the component is completed by the above-described processes.

The component thus manufactured has a high dielectric breakdown voltage and ensures a high adhesivity of the thermally sprayed film, compared to a component manufactured by forming a thermally sprayed film on a rough surface formed by performing roughening on a surface of an alumite layer. For example, the component thus manufactured preferably has a dielectric breakdown voltage of 2.5 KV or above and an adhesivity of the thermally sprayed film of 10 MPa or above. Further, the chamfered open ends of the through holes preferably have a curvature of R1 or above, more preferably a curvature of R2 or above.

Hereinafter, test examples for evaluating the alumite layer and the thermally sprayed film on which the components of the above embodiment are formed will be described.

Test Examples 1 to 5 and Comparative Examples 1 to 5

Figure 4:
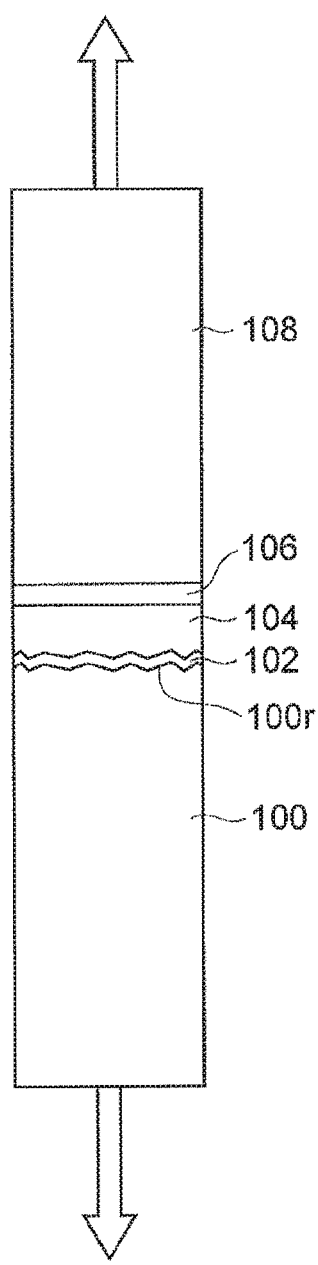
FIG. 4 is a view for explaining a tensile adhesive strength test in test examples 1 to 5.

In the test examples 1 to 5, a sample shown in FIG. 4 was prepared and tested by using a tensile adhesive strength test method defined in JIS H 8402. Specifically, there was prepared a cylindrical base material 100 made of A6061 and having a diameter of 25 mm and a length of 40 mm. Next, a rough surface 100r was formed by performing roughening on one end surface of the base material 100. As for the roughening, blast processing was performed. In the blast processing, an abrasive made of alumina ($Al_2O_3$) having a grain size of F60 defined in JIS R 6001 was used. An arithmetic average roughness Ra of the rough surface 100r was 3 μm. Then, an anodic oxidation process was performed on the rough surface 100r of the base material 100 by using organic acid-based solution. Accordingly, an alumite layer 102 having a thickness of 100 μm was formed. Thereafter, a thermally sprayed film 104 made of yttrium oxide and having a thickness of 300 μm was formed on the alumite layer 102. Next, the thermally sprayed film 104 was adhered to one end surface of another base material 108 by using an adhesive 106. The base material 108 was a cylindrical member made of A6061 and having a diameter of 25 mm and a length of 40 mm. In the test examples 1 to 5, the base materials 100 and 108 of the sample thus prepared were pulled in opposite directions (indicated by arrows in FIG. 4) in the lengthwise direction thereof to measure a stress (fracture stress) generated when fracture occurs at a boundary between the alumite layer 102 and the thermally sprayed film 104.

In the comparative examples 1 to 5, a sample was prepared and tested by the tensile adhesive strength test method defined in JIS H 8402. Specifically, a cylindrical base material made of A6061 and having a diameter of 25 mm and a length of 40 mm was prepared. Next, an alumite layer was formed on one end surface of the base material. Then, roughening was performed on the surface of the alumite layer. As for the roughening, blast processing was performed. In the blast processing, an abrasive made of alumina ($Al_2O_3$) having a grain size of F60 defined in JIS R 6001 was used.

An arithmetic average roughness Ra of the surface of the alumite layer after the blast processing was 4 μm. Thereafter, a thermally sprayed film made of yttrium oxide and having a thickness of 300 μm was formed on the alumite layer. The thermally sprayed film was adhered to one end surface of another base material by using the adhesive 106. The another base material was a cylindrical member made of A6061 and having a diameter of 25 mm and a length of 40 mm. In the comparative examples 1 to 5, the base materials of the sample thus prepared were pulled in opposite directions in the lengthwise direction thereof to measure a stress (fracture stress) generated when fracture occurs at a boundary between the alumite layer and the thermally sprayed film.

Table 1 shows the fracture stresses measured in the test examples 1 to 5 and the comparative examples 1 to 5. As can be seen from the following Table 1, the fracture stress was comparatively lower in the samples of the comparative examples 1 to 5, i.e., the samples obtained by forming the alumite layer on the surface of the base material by using the organic acid-based solution, performing the roughening on the alumite layer, and forming the thermally sprayed film on the rough surface. On the other hand, the fracture stress was considerably higher in the samples of the test examples 1 to 5, i.e., the samples obtained by performing the roughening on the surface of the base material, forming the alumite layer on the rough surface by using the organic acid-based solution, and forming the thermally sprayed film on the alumite layer.

TABLE 1

|  | Fracture load (N) | Fracture stress (MPa) |
| --- | --- | --- |
| Test example 1 | 11380 | 23.2 |
| Test example 2 | 10260 | 20.9 |
| Test example 3 | 9970 | 20.3 |
| Test example 4 | 9960 | 20.3 |
| Test example 5 | 9710 | 19.8 |
| Average of Test examples 1 to 5 | 10256 | 20.9 |
| Comparative example 1 | 7910 | 16.1 |
| Comparative example 2 | 8870 | 18.1 |
| Comparative example 3 | 8090 | 16.5 |
| Comparative example 4 | 8810 | 18 |
| Comparative example 5 | 8220 | 16.8 |
| Average of Comparative examples 1 to 5 | 8380 | 17.1 |

Test Examples 6 to 13 and Comparative Examples 6 to 13

In the test examples 6 to 13, a sample was prepared to measure a dielectric breakdown voltage. Specifically, there were prepared two plate-shaped base materials made of A6061, each having a thickness of 15 mm and a size of 200 mm square. In the test examples 6 to 12, 100 through holes were formed in each base material in a lattice pattern at an interval of 20 mm. Table 2 shows parameters of the through holes, i.e., a diameter Ø and a curvature R of R chamfering of open ends of the through holes. Through holes were not formed in the sample of the test example 13. In the test examples 6 to 13, roughening was performed on one main surface of the base material. As for the roughening, blast processing was performed. In the blast processing, an abrasive made of alumina ($Al_2O_3$) and having a grain size of F60 defined in JIS R 6001 was used. The arithmetic average roughness Ra of the rough surface was 3 µm. Next, an anodic oxidation process was performed on the rough surface of the base material by using organic acid-based solution. As a consequence, an alumite layer having a thickness of 100 µm was formed. Then, a thermally sprayed film made of yttrium oxide and having a thickness of 200 µm was formed on the alumite layer.

In the comparative examples 6 to 13, there were prepared two plate-shaped base materials made of A6061, each having a thickness of 15 mm and a size of 200 mm square. In the comparative examples 6 to 12, 100 through holes were formed in each base material in a lattice pattern at an interval of 20 mm. Table 2 shows parameters of the through holes, i.e., a diameter Ø and a curvature R of R chamfering of open ends of the through holes. Through holes were not formed in the sample of the comparative example 13. Then, an anodic oxidation process was performed on one main surface of the base material by using organic acid-based solution. Accordingly, an alumite layer having a thickness of 100 µm was formed. Next, roughening was performed on the surface of the alumite layer. As for the roughening, blast processing was performed. In the blast processing, an abrasive made of alumina ($Al_2O_3$) and having a grain size of F60 defined in JIS R 6001 was used. The arithmetic average roughness Ra of the surface of the alumite layer after the blast processing was 4 µm. Thereafter, a thermally sprayed film made of yttrium oxide and having a thickness of 200 µm was formed on the alumite layer.

In the test examples 6 to 12 and the comparative examples 6 to 12, a leading end of one of a pair of probes, each having a diameter of 1 mm, was connected to one portion of a flat part of the sample and a leading end of the other probe was brought into contact with a chamfered part of the through hole of the sample by a load of 300 g. A voltage of up to 4000V was applied from the pair of probes at a current of 99 µA and a step-up rate of 10V/sec, and a dielectric breakdown voltage was measured. In the test examples 6 to 12 and the comparative examples 6 to 12, five dielectric breakdown voltage were obtained by bringing the leading end of the other probe into contact with five different through holes. Then, an average of the five dielectric breakdown voltages was calculated. In the test example 13 and the comparative example 13, a leading end of one of a pair of probes, each having a diameter of 1 mm, was connected to one portion of a flat part of the sample and a leading end of the other probe was brought into contact with another portion of the flat part of the sample by a load of 300 g. A voltage of up to 4000V was applied from the pair of probes at a current of 99 µA and a step-up rate of 10V/sec, and a dielectric breakdown voltage was measured. In the test example 13 and the comparative example 13, five dielectric breakdown voltages were obtained by bringing the leading end of the other probe into contact with five different portions of the flat part. Then, an average of the five dielectric breakdown voltages was calculated. The result thereof is shown in Table 2. As can be seen from the following Table 2, the dielectric breakdown voltage was comparatively lower in the samples of the comparative examples 6 to 13, i.e., the samples obtained by forming an alumite layer on the surface of the base material by using organic acid-based solution, performing roughening on the alumite layer, and forming a thermally sprayed film on the rough surface thus formed. On the other hand, the dielectric breakdown voltage was considerably high and equal or close to a measurement limit value (4000V) in the samples of the test examples 6 to 13, i.e., the samples obtained by performing roughening on the surface of the base material, forming an alumite layer on the rough surface thus formed by using organic acid-based solution, and forming a thermally sprayed film on the alumite layer.

TABLE 2

|  | Test example No. | | | | | | | |
| --- | --- | --- | --- | --- | --- | --- | --- | --- |
|  | 6 | 7 | 8 | 9 | 10 | 11 | 12 | 13 |
| Through hole parameters | Ø0.8 R1 | Ø0.8 R1.5 | Ø0.8 R2 | Ø0.8 R2.5 | Ø0.8 R4 | Ø0.5 R2 | Ø0.5 R3 | |

TABLE 2-continued

|  | | | | | | | | |
|---|---|---|---|---|---|---|---|---|
| Average of dielectric breakdown voltage | 3980 | 3896 | 4000 | 3974 | 4000 | 4000 | 3928 | 4000 |

| | Comparative example No. | | | | | | | |
|---|---|---|---|---|---|---|---|---|
| | 6 | 7 | 8 | 9 | 10 | 11 | 12 | 13 |
| Through hole parameters | Ø0.8 R1 | Ø0.8 R1.5 | Ø0.8 R2 | Ø0.8 R2.5 | Ø0.8 R3 | Ø0.5 R2 | Ø0.5 R3 | |
| Average of dielectric breakdown voltage | 2942 | 3163 | 2950 | 3650 | 3833 | 3510 | 3685 | 4000 |

While the disclosure has been shown and described with respect to the embodiments, it will be understood by those skilled in the art that various changes and modifications may be made without departing from the scope of the disclosure as defined in the following claims.

What is claimed is:

1. A component for use in a plasma processing apparatus, which is to be exposed to a plasma, the component comprising:
   (i) a base material having a plurality of through holes and a first rough surface at which one end of each of the through holes is opened, the first rough surface of the base material formed only on a surface of the base material disposed outside of the through holes,
   (ii) an alumite layer having a second rough surface formed on the first rough surface of the base material by an anodic oxidation process, and
   (iii) a thermally sprayed film formed on the second rough surface of the alumite layer,
   wherein the plurality of through holes include substantially vertical sidewalls and tapered ends,
   wherein the alumite layer is formed on the substantially vertical sidewalls and the tapered ends,
   wherein the thermally sprayed film is formed on the alumite layer but is not provided on the substantially vertical sidewalls of the through holes, and
   wherein at a location of the first rough surface, the alumite layer is formed on the first rough surface and the thermally sprayed film is formed on the alumite layer while, on the substantially vertical sidewalls of the through holes, only the alumite layer is formed.

2. The component of claim 1, wherein the first rough surface of the base material has an arithmetic average roughness ranging from 1.5 µm to 5 µm.

3. The component of claim 1, wherein the component is configured to inject a gas into a processing chamber of the plasma processing apparatus.

4. The component of claim 1, wherein the component is a baffle plate provided between a sidewall of a processing chamber of the plasma processing apparatus and a mounting table provided in the processing chamber.

5. The component of claim 1, wherein the alumite layer has a thickness of about 20 µm to 150 µm.

6. The component of claim 5, wherein the alumite layer has a film thickness of 50 µm or above.

7. A plasma processing apparatus comprising the component of claim 1.

8. A method for manufacturing a component for use in a plasma processing apparatus, which is to be exposed to a plasma, the method comprising:
   providing a base material of the component having a plurality of through holes, the plurality of through holes having substantially vertical side walls and tapered ends;
   performing roughening on one surface of the base material at which one end of each of the plurality of through holes is opened so as to form a first rough surface, the first rough surface formed on the one surface only outside of the through holes;
   forming an alumite layer having a second rough surface on the first rough surface by an anodic oxidation process; and
   forming a thermally sprayed film on the second rough surface of the alumite layer,
   wherein the alumite layer is formed on the substantially vertical sidewalls and the tapered ends,
   wherein the thermally sprayed film is formed on the alumite layer but is not provided on the substantially vertical sidewalls of the through holes, and
   wherein at a location of the first rough surface, the alumite layer is formed on the first rough surface and the thermally sprayed film is formed on the alumite layer while, on the substantially vertical sidewalls of the through holes, only the alumite layer is formed.

9. The method of claim 8, wherein in said performing roughening to form the first rough surface, the first rough surface of the base material is formed to have an arithmetic average roughness ranging from 1.5 µm to 5 µm.

10. The method of claim 8, wherein the roughening to form the first rough surface is a blast processing, and an abrasive used for the blast processing has a grain size of F40 to F220 defined in JIS R 6001.

11. The method of claim 8, wherein the roughening to form the first rough surface is a blast processing, and an abrasive used for the blast processing is silicon carbide (SiC), glass bead, or zirconium.

12. The method of claim 8, wherein the tapered ends of each of the plurality of through holes are formed by a chamfering process prior to performing the roughening to form the first rough surface.

* * * * *